(12) United States Patent
Hsu

(10) Patent No.: US 10,361,160 B2
(45) Date of Patent: Jul. 23, 2019

(54) PACKAGE STRUCTURE AND ITS FABRICATION METHOD

(71) Applicant: PHOENIX & CORPORATION, Grand Cayman (KY)

(72) Inventor: Shih-Ping Hsu, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 0 days.

(21) Appl. No.: 15/782,943

(22) Filed: Oct. 13, 2017

(65) Prior Publication Data

US 2018/0108615 A1   Apr. 19, 2018

(30) Foreign Application Priority Data

Oct. 14, 2016   (TW) .............................. 105133328 A

(51) Int. Cl.
*H01L 23/538*        (2006.01)
*H01L 21/48*         (2006.01)
(Continued)

(52) U.S. Cl.
CPC ...... *H01L 23/5389* (2013.01); *H01L 21/4853* (2013.01); *H01L 21/563* (2013.01); *H01L 21/565* (2013.01); *H01L 21/6835* (2013.01); *H01L 21/76885* (2013.01); *H01L 23/3135* (2013.01); *H01L 23/3142* (2013.01); *H01L 23/5386* (2013.01); *H01L 24/16* (2013.01); *H01L 24/18* (2013.01); *H01L 24/81* (2013.01); *H01L 25/0657* (2013.01); *H01L 21/568* (2013.01); *H01L 24/32* (2013.01); *H01L 24/73* (2013.01); *H01L 2221/68345* (2013.01); *H01L 2221/68372* (2013.01); *H01L 2224/16237* (2013.01); *H01L 2224/18* (2013.01); *H01L 2224/32225* (2013.01);
(Continued)

(58) Field of Classification Search
CPC ....... H01L 2224/41173; H01L 23/3157; H01L 23/3142; H01L 21/4853; H01L 23/3135; H01L 21/563; H01L 21/568
See application file for complete search history.

(56) References Cited

U.S. PATENT DOCUMENTS

| 8,389,339 B2 * | 3/2013 | Tanuma | H01L 21/563 438/107 |
| 8,693,211 B2 * | 4/2014 | Tamadate | H01L 21/563 361/762 |

(Continued)

*Primary Examiner* — Latanya N Crawford
(74) *Attorney, Agent, or Firm* — WPAT, PC

(57) ABSTRACT

This disclosure provides a package structure and its fabrication method. The package structure includes: a conductive pattern layer having a bump region and a wiring region, the bump region comprising a plurality of conductive bumps and a first dielectric material surrounding the plurality of conductive bumps, the wiring region comprising a plurality of first conductive wires and a second dielectric material covering and surrounding the plurality of first conductive wires; a circuit device with a plurality of connecting terminals disposed on the bump region, each of the connecting terminals corresponding with one of the conductive bumps; an insulation sealant formed on the second dielectric material and around sidewalls of the circuit device; and a third dielectric material covering the circuit device and the wiring region.

12 Claims, 10 Drawing Sheets

(51) Int. Cl.
*H01L 21/56* (2006.01)
*H01L 21/683* (2006.01)
*H01L 21/768* (2006.01)
*H01L 23/00* (2006.01)
*H01L 25/065* (2006.01)
*H01L 23/31* (2006.01)

(52) U.S. Cl.
CPC ............... *H01L 2224/32237* (2013.01); *H01L 2224/73204* (2013.01); *H01L 2224/81193* (2013.01); *H01L 2224/83951* (2013.01); *H01L 2225/06517* (2013.01); *H01L 2225/06548* (2013.01); *H01L 2225/06558* (2013.01); *H01L 2225/06582* (2013.01); *H01L 2924/181* (2013.01)

(56) References Cited

U.S. PATENT DOCUMENTS

| | | | |
|---|---|---|---|
| 2009/0008765 A1* | 1/2009 | Yamano | H01L 24/83 257/690 |
| 2010/0013076 A1* | 1/2010 | Jang | H01L 21/561 257/687 |
| 2010/0078791 A1* | 4/2010 | Yim | H01L 25/0655 257/686 |
| 2012/0120624 A1* | 5/2012 | Tamadate | H01L 21/563 361/783 |
| 2012/0319274 A1* | 12/2012 | Tanaka | H01L 23/49816 257/738 |
| 2017/0178984 A1* | 6/2017 | Ko | H01L 22/34 |

\* cited by examiner

PACKAGE STRUCTURE AND ITS FABRICATION METHOD

CROSS REFERENCE TO RELATED APPLICATION

This application claims the benefit of Taiwan application Serial No. 105133328, filed on Oct. 14, 2016, the disclosure of which is incorporated by reference herein in its entirety.

FIELD OF THE INVENTION

The present invention relates to a package structure and its fabrication method and, more particularly, to a package structure fabricated by the large-area panel-level or wafer-level packaging technology.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package structure and the package technology are evolved accordingly to meet the trend.

Conventionally, a wafer-level packaging process can be illustrated in FIG. 1A-1C. At first, an adhesive layer 18 is formed on a wafer carrier 11 as shown in FIG. 1A. Next, a semiconductor die 13 and an electronic component 15 with their connection terminals at the bottoms are bonded onto the carrier 11 through the adhesive layer 18, and then a molding compound 12 is formed on the carrier 11 to cover the semiconductor die 13 and the electronic component 15 to be a package unit as shown in FIG. 1B. After the carrier 11 and the adhesive layer 18 is removed, the semi-finished package structure 20 is turned over and a redistribution layer (RDL) 17 is then formed on the upper surface 21 of the semi-finished package structure 20 as shown in FIG. 1C.

It is difficult to fabricate a fine-pitch-wiring RDL 17 by a conventional photolithography means, because fine-pitch wires can be realized only if the upper surface 21 of the semi-finished package structure 20 is very flat. However, to achieve the high surface flatness, a costly adhesive is needed as the adhesive layer 18 and the semiconductor die 13 and the electronic component 15 have to be bonded onto the adhesive layer 18 in a slow and precise way, which would increase the fabrication cost. Therefore, it is in need of a new and advanced packaging solution to reduce the fabrication cost.

SUMMARY OF THE INVENTION

According to one aspect of the present disclosure, one embodiment provides a package structure including: a conductive pattern layer having a bump region and a wiring region, the bump region comprising a plurality of conductive bumps and a first dielectric material surrounding the plurality of conductive bumps, the wiring region comprising a plurality of first conductive wires and a second dielectric material covering and surrounding the plurality of first conductive wires; a circuit device with a plurality of connecting terminals disposed on the bump region, each of the connecting terminals corresponding with one of the conductive bumps; an insulation sealant formed on the second dielectric material and around sidewalls of the circuit device; and a third dielectric material covering the circuit device and the wiring region.

In one embodiment, the package structure further comprises: a blocking frame having edgings between the bump region and the wiring region; wherein the sidewalls of the circuit device are arranged on the edgings of the blocking frame.

In one embodiment, the blocking frame comprises metal or organic insulation material.

In one embodiment, the package structure further comprises: a plurality of first conductive pillars formed on the plurality of first conductive wires and covered by the third dielectric material.

In one embodiment, the circuit device comprises a semiconductor chip or an electronic component.

In one embodiment, the package structure further comprises: a pillar layer formed below the conductive pattern layer and comprising a plurality of second conductive pillars and a fourth dielectric material surrounding the plurality of second conductive pillars; and a redistribution layer formed below the pillar layer and comprising a plurality of second conductive wires and a fifth dielectric material surrounding the plurality of second conductive wires.

According to one aspect of the present disclosure, one embodiment provides a method for fabricating a package structure which includes: (A) forming a conductive pattern layer on a carrier substrate, wherein the conductive pattern layer has a bump region comprising a plurality of conductive bumps and a wiring region comprising a plurality of conductive wires; (B) forming a second dielectric material on the carrier substrate while enabling the second dielectric material to cover the plurality of conductive wires; (C) disposing a circuit device with a plurality of connecting terminals on the bump region while enabling each of the connecting terminals to correspond with one of the conductive bumps; (D) forming an insulation sealant on the second dielectric material and around sidewalls of the circuit device; (E) forming a third dielectric material on the carrier substrate while enabling the third dielectric material to cover the circuit device and the wiring region; (F) removing the carrier substrate and forming a fourth dielectric material on the conductive pattern layer and the circuit device, while enabling the fourth dielectric material to surround the plurality of conductive bumps and the plurality of connecting terminals of the circuit device; and (G) forming a plurality of metal pillars in the fourth dielectric material while enabling each of the metal pillars to be connected to one of the conductive bumps and the conductive wires.

According to one aspect of the present disclosure, one embodiment provides a method for fabricating a package structure which includes: (A) forming a conductive pattern layer on a carrier substrate, wherein the conductive pattern layer has a bump region comprising a plurality of conductive bumps, a blocking frame having edgings surrounding the bump region, and a wiring region comprising a plurality of conductive wires surrounding the metal blocking frame; (B) forming a second dielectric material on the carrier substrate while enabling the second dielectric material to cover the metal blocking frame and the plurality of conductive wires; (C) disposing a circuit device with a plurality of connecting terminals on the bump region and the metal blocking frame while enabling each of the connecting terminals corresponding with one of the conductive bumps and the sidewalls of the circuit device to be arranged on the edgings of the blocking frame; (D) forming an insulation sealant on the second dielectric material and around sidewalls of the circuit device; (E) forming a third dielectric material on the carrier substrate while enabling the third dielectric material to cover the circuit device and the wiring region; (F) removing the carrier substrate and forming a fourth dielectric material on the conductive pattern layer and the circuit device, while enabling the fourth dielectric material to surround the plurality of conductive bumps and the plurality of connecting terminals of the circuit device; and (G) forming a plurality of metal pillars in the fourth dielectric material while enabling each of the metal pillars to be connected to one of the conductive bumps and the conductive wires.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1A:
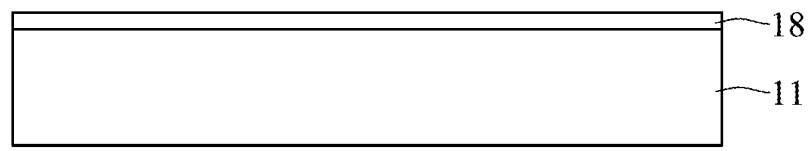
FIG. 1A-1C shows a conventional wafer-level packaging process.
Figure 1B:
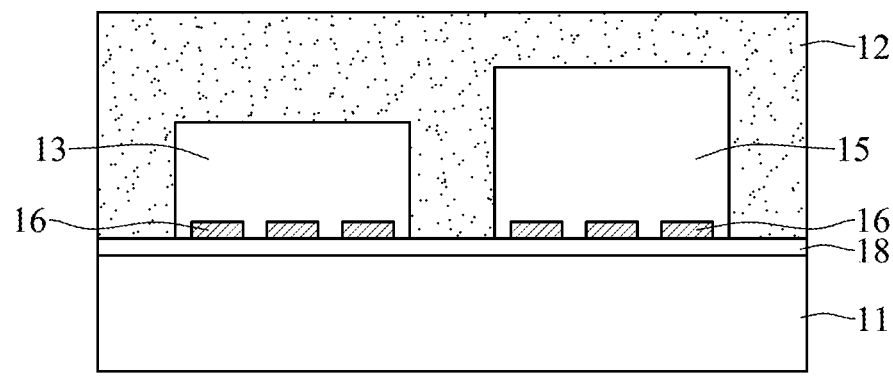
Figure 1C:
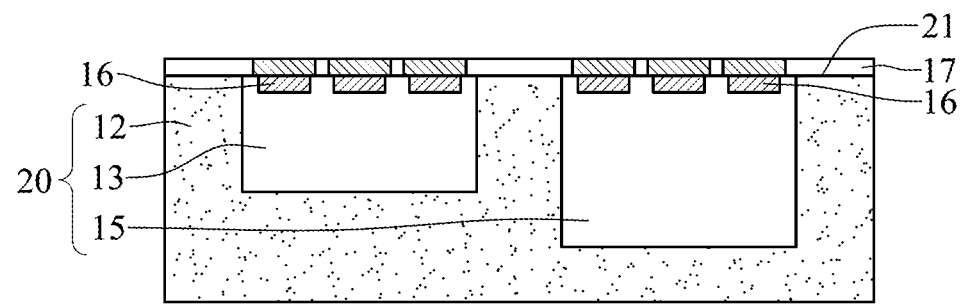
Figure 2A:
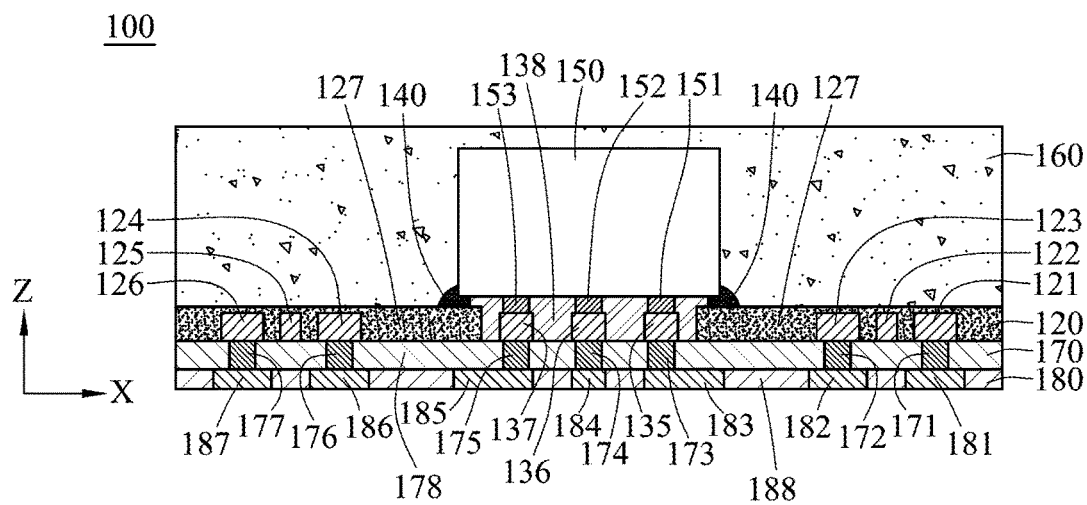
FIG. 2A shows a cross-sectional view of the package structure according to a first embodiment of the present invention.
Figure 3A:
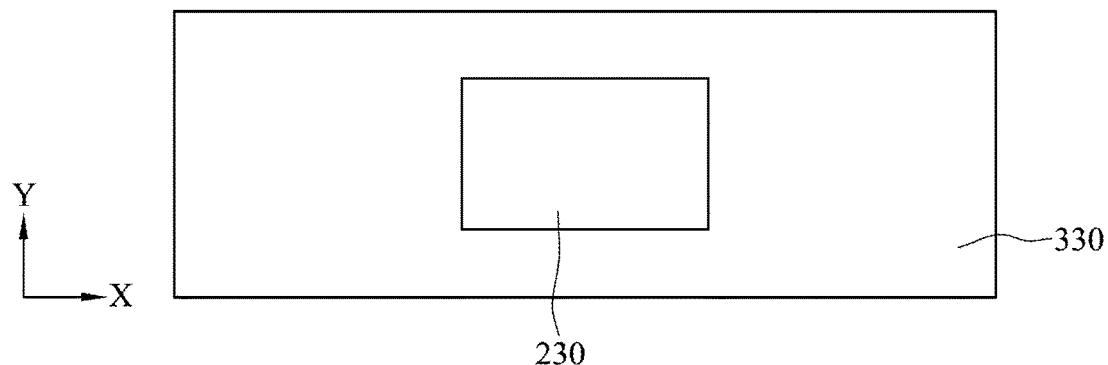
FIG. 3A shows a plan view of the conductive pattern layer according to the first embodiment.

FIG. 2A shows a cross-sectional view of the package structure 100 according to a first embodiment of the present invention. The package structure 100 includes: a redistribution layer (RDL) 180, a pillar layer 170, a conductive pattern layer 120, a circuit device 150, a insulation sealant 140 and a dielectric material 160 as shown in FIG. 2A. The conductive pattern layer 120 may divide into a bump region 230 and a wiring region 330, with its plan view illustrated in FIG. 3A. In other words, FIG. 2A represents the cross-sectional view of the package structure 100 in the X-Z plane with the Z-axis directing upwards, and FIG. 3A represents the plan view of the conductive pattern layer 120 in the X-Y plane. Thus, the package structure 100 is a layered structure with the RDL 180 locating at the bottom and the pillar layer 170, the conductive pattern layer 120, the circuit device 150 and the dielectric material 160 stacking upwards in sequence. The bump region 230 is basically square or rectangular, and the wiring region 330 encloses the bump region 230. The insulation sealant 140 is formed on the wiring region 330 and around all sidewalls of the circuit device 150, especially the lower part of the sidewalls. In other embodiments, the bump region 230 may have the other shape similar to the shape of the circuit device 150 to be disposed thereon. All the sidewalls of the circuit device 150 should be arranged on the wiring region 330, so that the bump region 230 can be enclosed by the combination of the circuit device 150, the wiring region 330 and the pillar layer 170. The insulation sealant 140 may be a sealing adhesive made of resin material and formed around the lower part of all sidewalls of the circuit device 150 by a dispensing means or a thin-film vacuum sealing means.

As shown in FIG. 2A, the bump region 230 may comprise conductive bumps 135-137 and a dielectric material 138 surrounding the conductive bumps 135-137 and the connecting terminals 151-153 of the circuit device 150, and the wiring region 330 may comprise conductive wires 121-126 and a dielectric material 127 covering and surrounding the conductive wires 121-126; wherein, the dielectric material 138 may be thicker than the dielectric material 127. The location of the conductive bumps 135-137 is arranged so that each of the conductive bumps 135-137 corresponds with one of the connecting terminals 151-153 of the circuit device 150. For example, the conductive bumps 135-137 may be arranged in the form of a matrix, with rows and columns. The separation between the neighboring conductive bumps 135-137 may be less than 10 μm. The conductive wires 121-126 may represent the upper-layer of the predefined circuitry layout of the package structure 100. The pillar layer 170 is formed below the conductive pattern layer 120 and may comprise conductive pillars 171-177 and a dielectric material 178 surrounding the conductive pillars 171-177.

The RDL 180 is formed below the pillar layer 170, representing the lower-layer of the predefined circuitry layout of the package structure 100, and may comprise conductive wires 181-187 and a dielectric material 188 surrounding the conductive wires 181-187. The conductive bumps 135-137 and the conductive wires 121, 123, 124 and 126 can be connected to the RDL 180 through the conductive pillars 171-177, so that the conductive bumps 135-137 can be redistributed to the other proper locations. Thus, the conductive wires 121-126, 181-182 and 186-187 can be arranged in a high-density or fine-pitch circuit layout.

The circuit device 150 may be a semiconductor chip or an electronic component, which is a die diced from a semiconductor wafer following the IC fabrication process. The circuit device 150 is provided with connection terminals 151-153 in the form of pin, pad or solder bump. In the embodiment, the circuit device 150 is an ASIC (Application-Specific Integrated Circuit) or an AP (Application Processor). The dielectric material 160 covers the circuit device 150 and the wiring region 330, and it can be formed of a material selected from the group consisting of novolac-based resin, epoxy-based resin and silicon-based resin by a molding means like compression molding. But it is not limited thereto; a liquid-resin filling means or a thin-film vacuum molding means can be used as well. In the embodiments, the dielectric materials 127, 138, 160, 178 and 188 may be made of either the same material or different materials, the dielectric material 127 can either totally or partly cover the conductive wires 121-126, and the dielectric material 127 can have either the same thickness as the conductive wires 121-126 or not; it is not limited thereto in this disclosure.

As the circuit device 150 is disposed on the conductive pattern layer 120, each of its connecting terminals 151-153 is aligned with one of the conductive bumps 135-137 in the bump region 230. Here, the circuit device 150 may be spaced from the dielectric material 127, with a gap therebetween as shown in FIG. 2A. To make sure that no gap or separation exists between the circuit device 150 and the dielectric material 127, the insulation sealant 140 is applied onto the dielectric material 127 around the bottom edging and all the sidewalls of the circuit device 150, especially the lower part of the sidewalls. The circuit device 150, the dielectric material 127 and the insulation sealant 140 can be combined to be a gapless mold; thus, when the dielectric material 160 is formed by molding, it would not leak into the bump region 230. The leakage of the dielectric material 160 might cause bubbles or voids in the formation of the dielectric material 138, and that would be disadvantageous for the fabrication process of fine-pitch circuit or high-density bumps. The insulation sealant 140 may be made of a fluid or thin-film resin material.

Figure 4A:
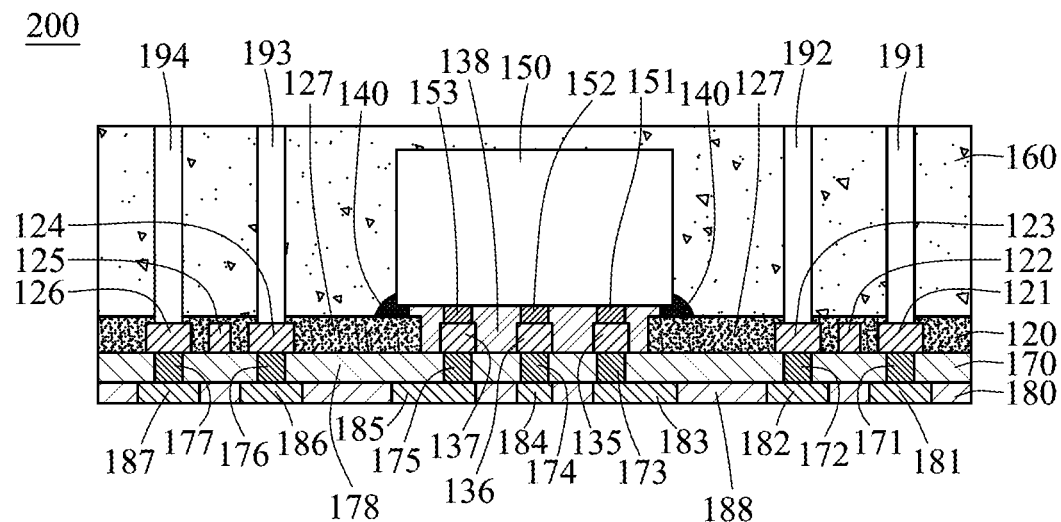
FIG. 4A is a cross-sectional view of a package structure according to a second embodiment of the present invention.

FIG. 4A is a cross-sectional view of a package structure 200 according to a second embodiment of the present invention. The package structure 200 is in many ways identical to the package structure 100 of the first embodiment in FIG. 2A, but it further comprises metal pillars 191-194 on the conductive wires 121, 123, 124, 126 in the dielectric material 160. Compared to the package structure 100, the package structure 200 may have more flexibility in the design of circuit layout and be further processed to form a stacked package structure, e.g. the fifth embodiment that will be described later.

Figure 2B:
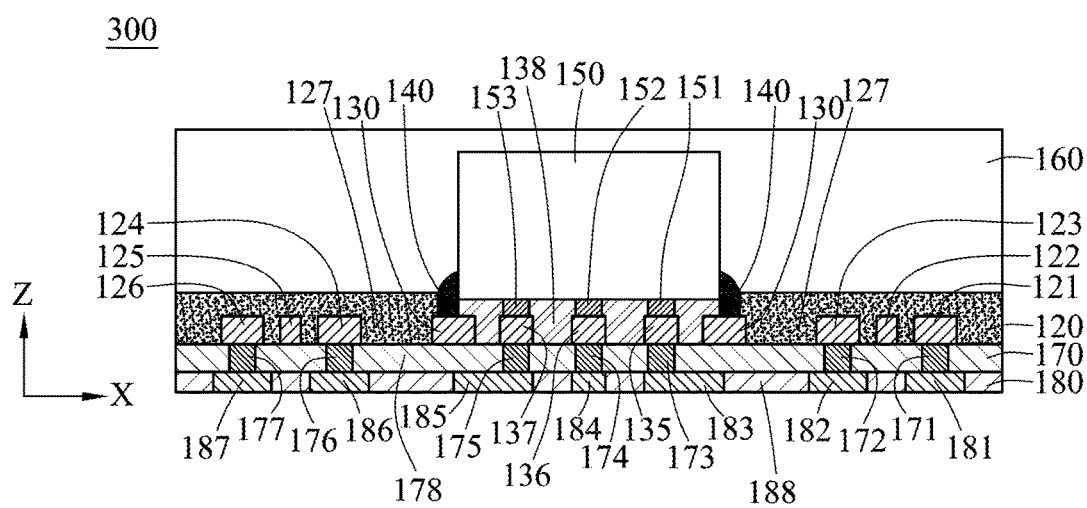
FIG. 2B shows a cross-sectional view of the package structure according to a third embodiment of the present invention.
Figure 3B:
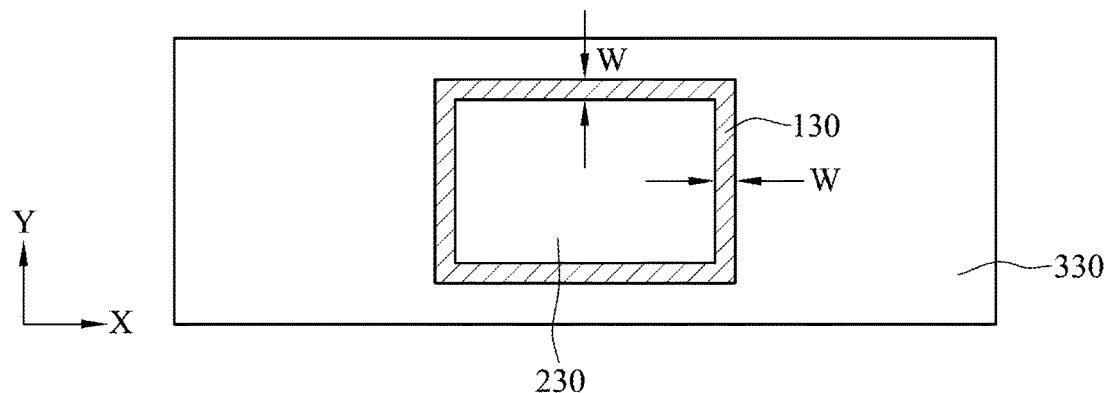
FIG. 3B shows a plan view of the conductive pattern layer according to the third embodiment.

FIG. 2B is a cross-sectional view of a package structure 300 according to a third embodiment of the present invention. The package structure 300 is in many ways identical to the package structure 100 of the first embodiment in FIG. 2A, but it further comprises a blocking frame 130 in the conductive pattern layer 120. The blocking frame 130 may consist of edging members between the bump region 230 and the wiring region 330. The edging members may have a width W as shown in FIG. 3B, and all sidewalls of the circuit device 150 fall vertically in the range of the width W; that is, all sidewalls of the circuit device 150 are positioned above the edging members of the blocking frame 130 as shown in FIG. 2B. In the embodiment, the conductive pattern layer 120 has a plan view including: a bump region 230, a blocking frame 130 enclosing the bump region 230, and a wiring region 330 enclosing the blocking frame 130, and FIG. 3B represents the plan view of the conductive pattern layer 120 in the X-Y plane. Here, the blocking frame 130 may be formed of metal or organic insulation material and in a shape of a rectangle with four edging members. The bump region 230 is inside the blocking frame 130 and the wiring region 330 is outside the blocking frame 130. In other embodiments, the blocking frame 130 may have the other shape similar to the shape of the circuit device 150 to be disposed thereon.

As shown in FIG. 2B, the dielectric material 127 is formed on the blocking frame 130 and the conductive wires 121-126. As the circuit device 150 is disposed on the bump region 230, each of its connecting terminals 151-153 is aligned with one of the conductive bumps 135-137 in the bump region 230. Here, the circuit device 150 may be spaced from the dielectric material 127 and the blocking frame 130, with a gap therebetween as shown in FIG. 2B. The bottom of the circuit device 150 may be higher than the top of the blocking frame 130 and lower than the top of the dielectric material 127. To make sure that no gap or separation exists between the circuit device 150 and the dielectric material 127, the insulation sealant 140 is applied onto the blocking frame 130 around all the sidewalls of the circuit device 150 and is adjacent to the dielectric material 127, especially the lower part of the sidewalls. The circuit device 150, the dielectric material 127, the blocking frame 130 and the insulation sealant 140 can be combined to be a gapless mold; thus, when the dielectric material 160 is formed by molding, it would not leak into the bump region 230. The blocking frame 130, the conductive wires 121-126 and the conductive bumps 135-137 can be together formed in the conductive pattern layer 120 in the same fabrication process. Moreover, the blocking frame 130 may shield the bump region 230 from electromagnetic radiation because the metal frame encloses the conductive bumps 135-137 and the connecting terminals 151-153 of the circuit device 150.

Figure 4B:
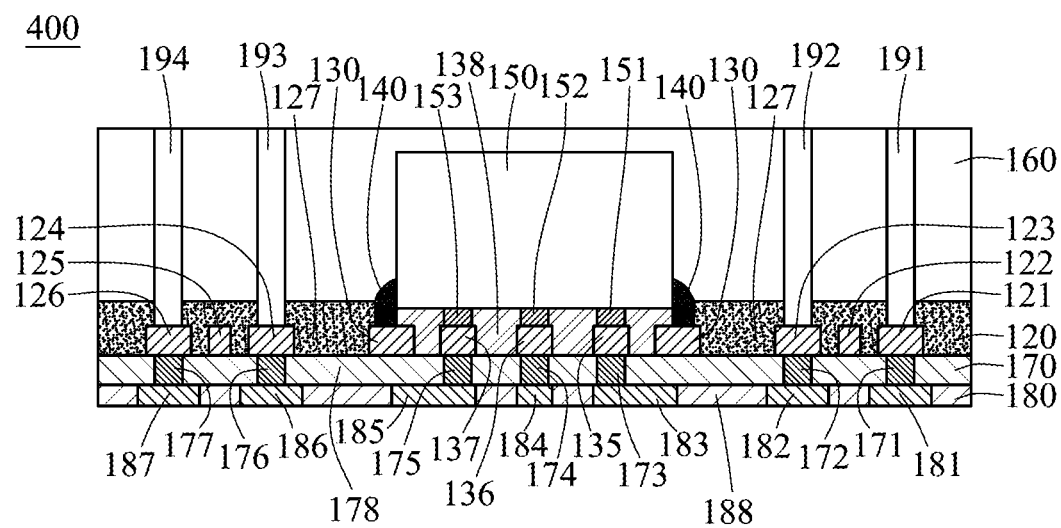
FIG. 4B is a cross-sectional view of a package structure according to a fourth embodiment of the present invention.

FIG. 4B is a cross-sectional view of a package structure 400 according to a fourth embodiment of the present invention. The package structure 400 is in many ways identical to the package structure 300 of the third embodiment in FIG. 2B, but it further comprises metal pillars 191-194 on the conductive wires 121, 123, 124, 126 in the dielectric material 160. Compared to the package structure 300, the package structure 400 may have more flexibility in the design of circuit layout and be further processed to form a stacked package structure.

The fabrication process will be described in detail in the following paragraphs. Wherein, FIGS. 5A, 6A, 7A, 8A and 2A are cross-sectional views of the package structure 100 according to the first embodiment in the present disclosure, corresponding to different process steps.

At first, a carrier substrate 110 is provided to carry and support electronic components and conductive wires of the package structure 100 in the fabrication process. The carrier substrate 110 can be a metal plate or a dielectric plate coated with a metal layer, in which the metal can be Fe, Cu, Ni, Sn, Al, Ni/Au or their combination.

Figure 5A:
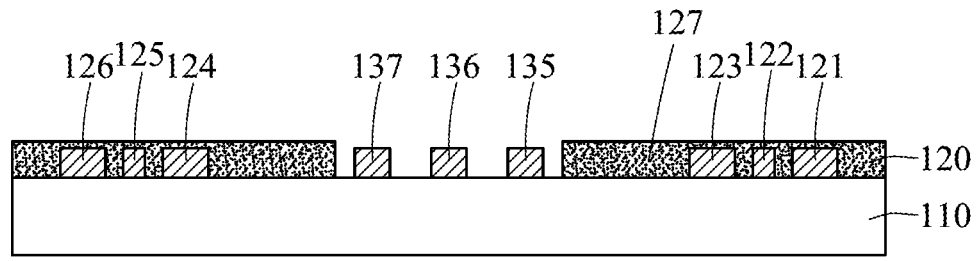
FIGS. 5A, 6A, 7A and 8A are cross-sectional views of the package structure according to the first embodiment, corresponding to different process steps.

Next, a patterned metal layer including fine-pitch dots and threads is formed on the carrier substrate 110 by the electrolytic plating and photolithography means. The patterned metal layer would be the conductive bumps 135-137 and conductive wires 121-126 in the conductive pattern layer 120. The conductive bumps 135-137 are located in the bump region 230, and the conductive wires 121-126 are located in the wiring region 330, which encloses the bump region 230 as shown in FIG. 3A. The bump region 230 may be square or rectangle-shaped. Next, a layer of dielectric material 127 is deposited on the carrier substrate 110 to cover the conductive pattern layer 120. By the photolithography, plasma etching, and/or sand blasting means, the dielectric material 127 in the bump region 230 is removed, so that the dielectric material 127 covers the conductive wires 121-126 but not the conductive bumps 135-137 as shown in FIG. 5A.

Figure 6A:
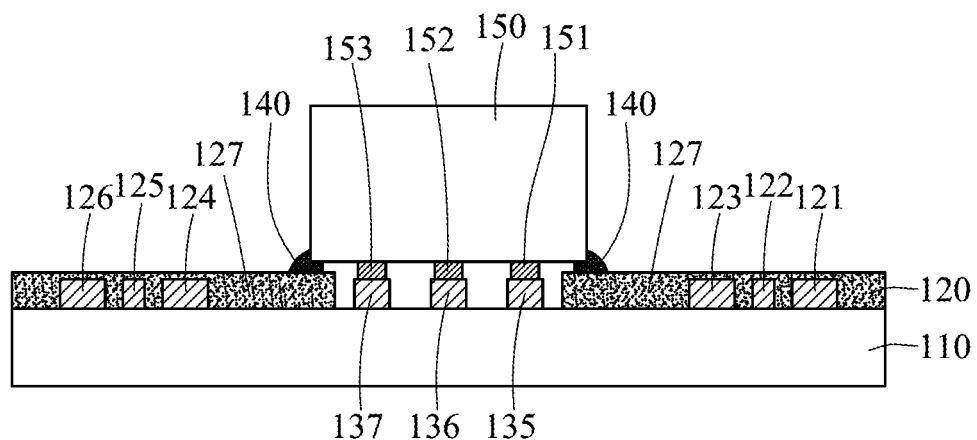

Next, a circuit device 150 with connecting terminals 151-153 is disposed on the conductive pattern layer 120. As the circuit device 150 is disposed on the conductive pattern layer 120, each of its connecting terminals 151-153 is aligned with one of the conductive bumps 135-137 in the bump region 230. Here, the circuit device 150 may be slightly spaced from the dielectric material 127, with a gap therebetween as shown in FIG. 6A. Since the dielectric material 160 will be formed on the carrier substrate 110 by the molding-like means in the subsequent process, to cover the circuit device 150 and the wiring region 330, the insulation sealant 140 is then applied onto the dielectric material 127 around the bottom edging and all the sidewalls of the circuit device 150 as shown in FIG. 6A, especially the lower part of the sidewalls, to make sure that no gap or separation exists between the circuit device 150 and the dielectric material 127. The insulation sealant 140 may be a sealing adhesive made of resin material and formed around the lower part of all sidewalls of the circuit device 150 by a dispensing means or a thin-film vacuum sealing means. The circuit device 150, the dielectric material 127 and the insulation sealant 140 can be combined to be a gapless mold; thus, when the dielectric material 160 is formed by molding, it would not leak into the bump region 230.

Figure 7A:
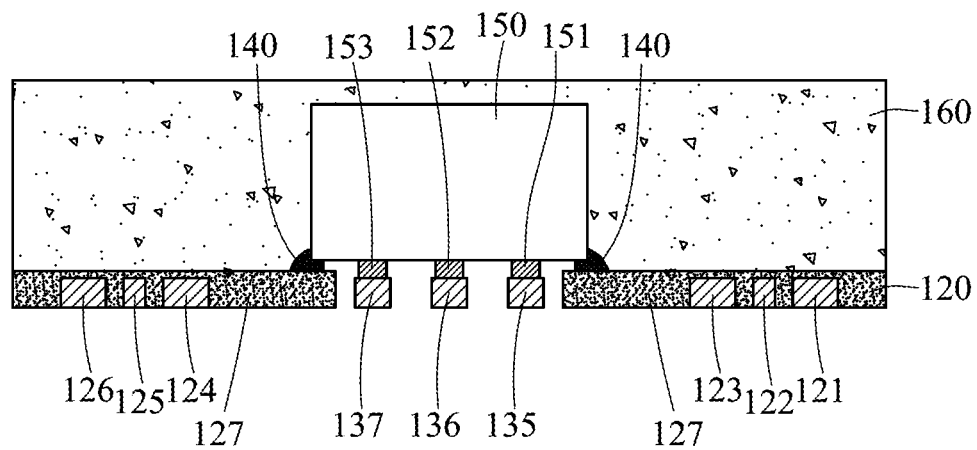

Next, a dielectric material 160 is formed on the carrier substrate 110 to cover the circuit device 150 and the wiring region 330 of the conductive pattern layer 120 as shown in FIG. 7A. The dielectric material 160 can be formed of an insulation material selected from the group consisting of novolac-based resin, epoxy-based resin and silicon-based resin by a molding means like compression molding, liquid resin filling or vacuum sealing. After the dielectric material 160 is cured or hardened, the circuit device 150 and the dielectric material 160 can be combined to be a firm package unit. The carrier substrate 110 is then removed as shown in FIG. 7A. As above-recited, the circuit device 150, the dielectric material 127 and the insulation sealant 140 are combined into be a gapless mold, so the dielectric material 160 would not leak into the space below the circuit device 150 in the molding process of the dielectric material 160. Here, there are only metal islands spaced from each other in a matrix form below the circuit device 150; e.g. the conductive bump 135 and the connecting terminal 151 can be combined to be a first island, the conductive bump 136 and the connecting terminal 152 can be combined to be a second island, and the conductive bump 137 and the connecting terminal 153 can be combined to be a third island. In other embodiments, the conductive bumps 135-137 may have connections therebetween, or the conductive bumps 135-137 may be electrically connected to the conductive wires 121-126; it is not limited thereto in this disclosure.

Figure 8A:
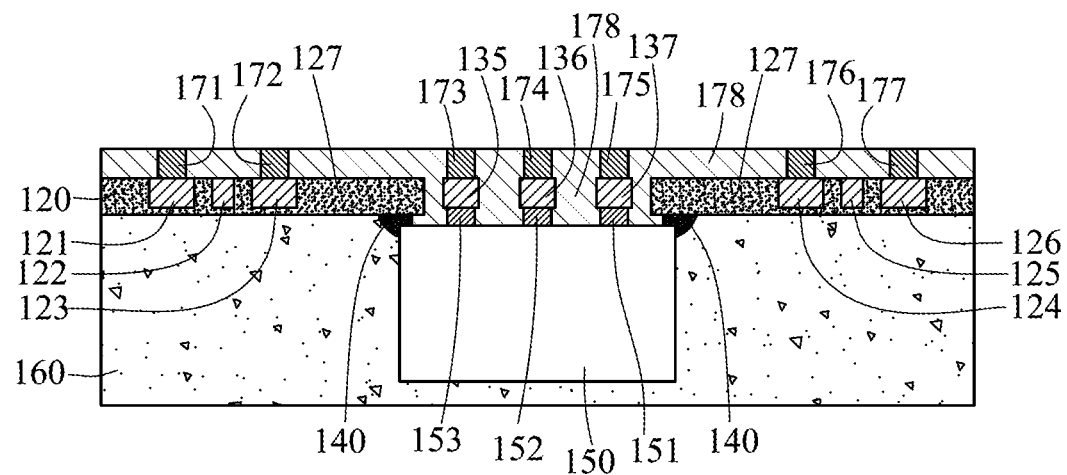

Next, the semi-finished package structure of FIG. 7A is turned over and the dielectric material 178 is then formed on the semi-finished package structure to cover the conductive pattern layer 120 and the circuit device 150; wherein, the dielectric material 178 is separated from the dielectric material 160 by the insulation sealant 140. Since the metal islands are spaced from each other, the dielectric material 178 can more easily fill up the space above the circuit device 150 to enclose the metal islands and cover the wiring region 330 of the conductive pattern layer 120, by the dispensing, liquid resin filling, compression molding, or vacuum sealing means. Thus, the possibility of the formation of voids in the dielectric material 178 can be effectively minimized After that, the pillar layer 170 including metal pillars 171-177 is formed in the dielectric material 178 as shown in FIG. 8A, by the laser engraving (or photolithography and plasma etching) and electrolytic plating means. Each of the metal pillars 171-178 is connected to one of the conductive bumps 135-137 and the conductive wires 121-126. Thereby, we may use an ordinary dielectric material but not the costly material "underfill" to form the dielectric material 178, to surround the connecting terminals 151-153 of the circuit device 150.

Next, the build-up process may be used to form the RDL 180 on the pillar layer 170 as shown in FIG. 2A. The RDL 180 may comprise conductive wires 181-187 and a dielectric material 188 surrounding the conductive wires 181-187. The conductive bumps 135-137 and the conductive wires 121, 123, 124 and 126 can be connected to the RDL 180 through the conductive pillars 171-177, so that the conductive bumps 135-137 can be redistributed to the other proper locations. Thus, the conductive wires 121-126, 181-182 and 186-187 can be arranged in a high-density or fine-pitch circuit layout.

Figure 6B:
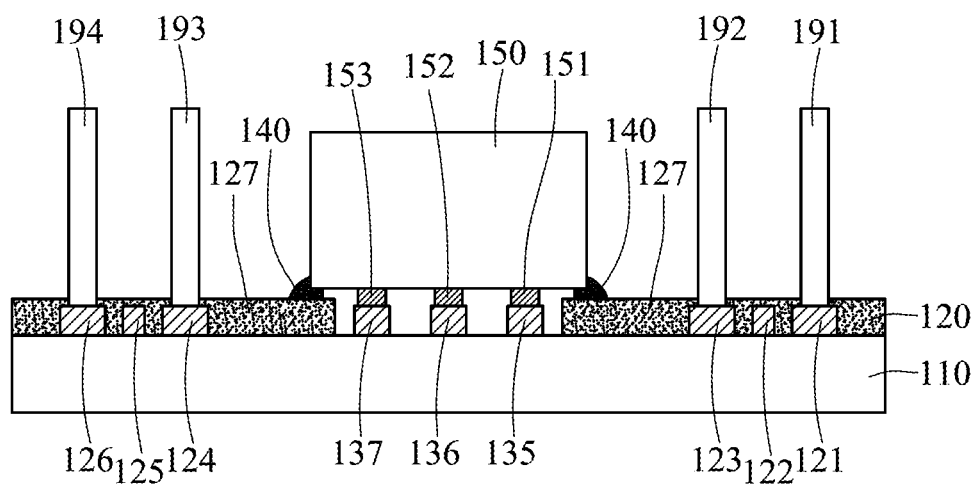
FIG. 6B is a cross-sectional view of a package structure according to another embodiment of the present invention.
Figure 7B:
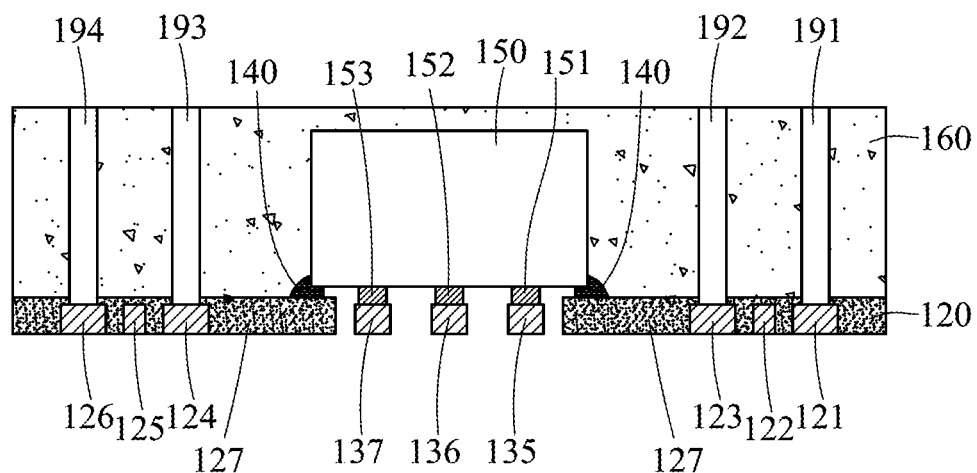
Figure 8B:
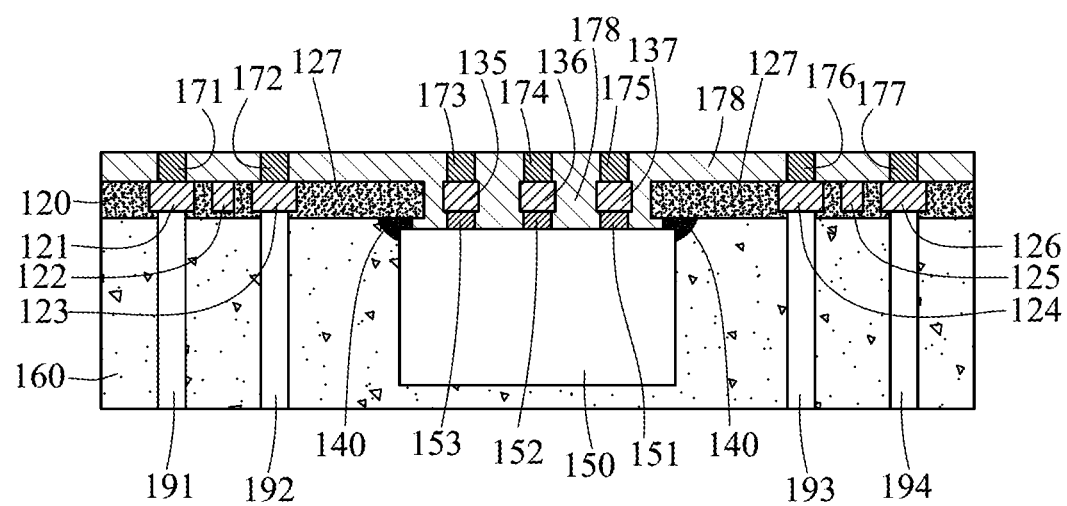

To improve the flexibility in the design of circuit layout in the package structure 100, metal pillars 191-194 can be formed on the conductive wires 121, 123, 124, 126 as recited in the second embodiment. As shown in FIGS. 6B, 7B and 8B, corresponding to FIGS. 6A, 7A and 8A, the metal pillars 191-194 can be formed by the photolithography and electrolytic plating means. Here, the metal pillars 191-194 can be formed either before or after the deposition of the circuit device 150. As shown in FIG. 7B, the upper part of the dielectric material 160 and the metal pillars 191-194 has to be removed by the polishing or plasma-etching means.

Figure 5B:
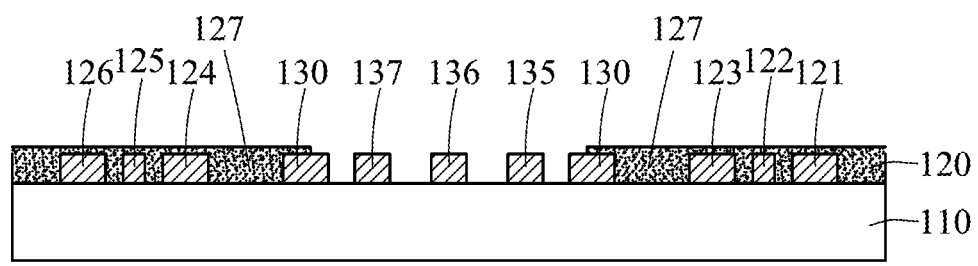
FIGS. 5B, 6C, 7B and 8B are cross-sectional views of the package structure according to the third embodiment, corresponding to different process steps.
Figure 6C:
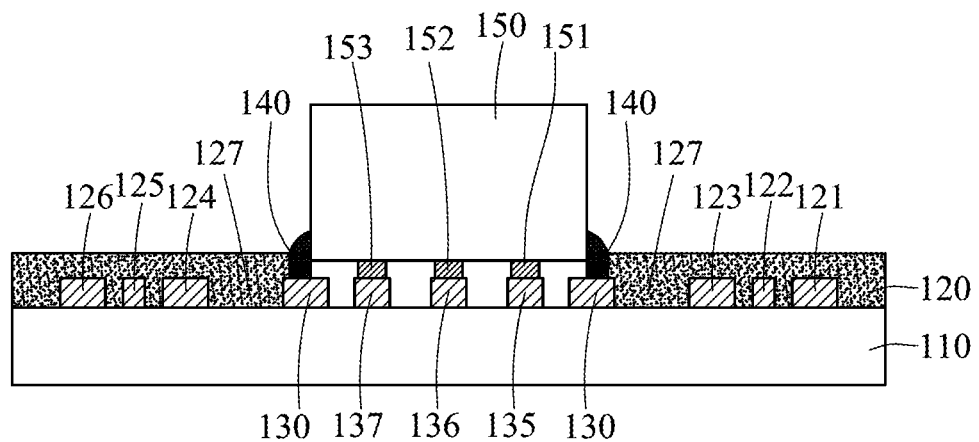

The fabrication process of the package structure 300 in the third embodiment is in many ways identical to that of the package structure 100 in the first embodiment, and the major discrepancy can be seen in FIGS. 5B and 6C, respectively compared with FIGS. 5A and 6A. When the patterned metal layer is formed on the carrier substrate 110, it would include the conductive bumps 135-137, the blocking frame 130, and conductive wires 121-126. The conductive bumps 135-137 are located in the bump region 230, the conductive wires 121-126 are located in the wiring region 330, and the blocking frame 130 is interposed between the bump region 230 and wiring region 330 as shown in FIG. 3B. The blocking frame 130 may be shaped in a rectangle with edging members of width W. In other embodiments, the blocking frame 130 may have the other shape similar to the shape of the circuit device 150 to be disposed thereon. As the circuit device 150 is disposed on the bump region 230, each of its connecting terminals 151-153 is aligned with one of the conductive bumps 135-137 in the bump region 230, and all sidewalls of the circuit device 150 fall vertically in the range of edging width W; that is, all sidewalls of the circuit device 150 are positioned above the edging members of the blocking frame 130 as shown in FIG. 6C. Here, the circuit device 150 may be slightly spaced from the dielectric material 127 and the blocking frame 130, with a gap therebetween. The insulation sealant 140 is then applied onto the blocking frame 130 around all the sidewalls of the circuit device 150, especially the lower part of the sidewalls. The circuit device 150, the dielectric material 127, the blocking frame 130 and the insulation sealant 140 can be combined to be a gapless mold; thus, when the dielectric material 160 is formed by molding, it would not leak into the bump region 230. Moreover, the dielectric material 127 covers the conductive wires 121-126 and a part of the blocking frame 130, but not the conductive bumps 135-137, as shown in FIG. 5B.

Figure 6D:
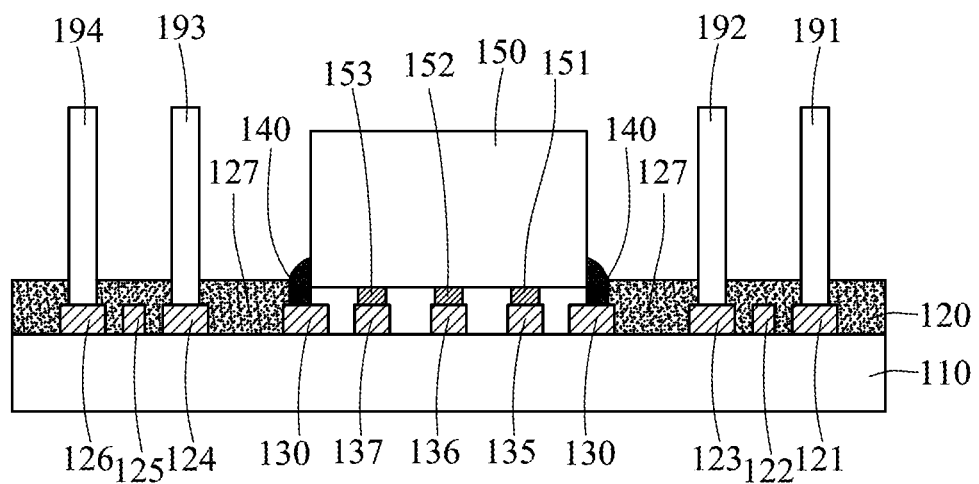
FIG. 6D is a cross-sectional view of a package structure according to another embodiment of the present invention.

To improve the flexibility in the design of circuit layout in the package structure 300, metal pillars 191-194 can be formed on the conductive wires 121, 123, 124, 126 as recited in the second embodiment. As shown in FIG. 6D, corresponding to FIG. 6C, the metal pillars 191-194 can be formed by the photolithography and electrolytic plating means. Here, the metal pillars 191-194 can be formed either before or after the deposition of the circuit device 150. As shown in FIG. 7B, the upper part of the dielectric material 160 and the metal pillars 191-194 has to be removed by the polishing or plasma-etching means.

Figure 9:
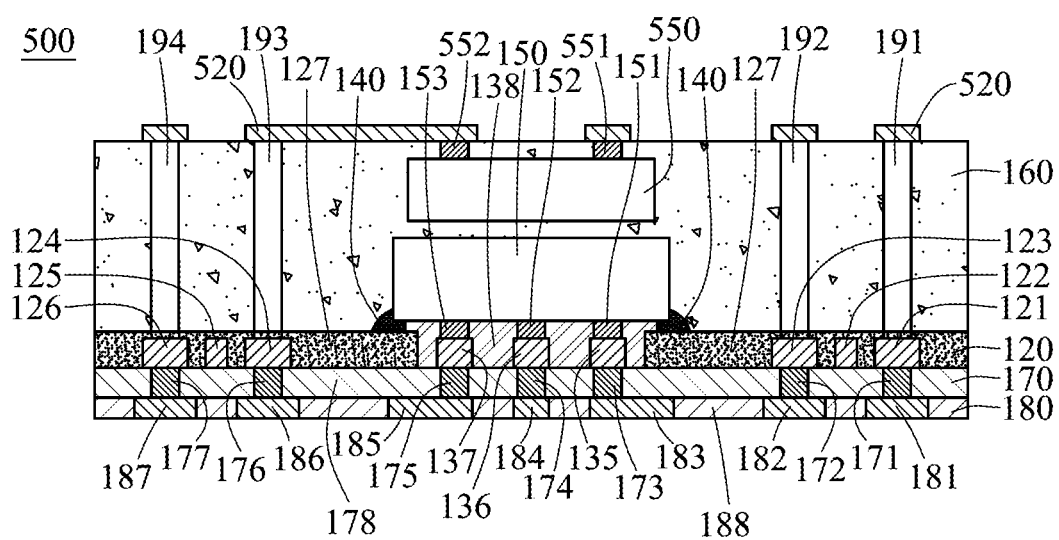
FIG. 9 is a cross-sectional view of a package structure according to a fifth embodiment of the present invention.

FIG. 9 is a cross-sectional view of a package structure 500 according to a fifth embodiment of the present invention. The package structure 500 is in many ways identical to the package structure 200 of the second embodiment in FIG. 4A, but it further comprises another circuit device 550 in the dielectric material 160 and another wiring layer 520 on the dielectric material 160. The circuit device 550 has connecting terminals 551-552 on its top, which are connected to the wiring layer 520. Compared to the package structure 200, the package structure 500 is a stacked package structure with more flexibility in the design of circuit layout.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package structure comprising:
    a conductive pattern layer comprising:
        a bump region comprising a plurality of conductive bumps and a first dielectric material surrounding the plurality of conductive bumps; and
        a wiring region comprising a plurality of first conductive wires and a second dielectric material, wherein said second dielectric material covers and tops a first conductive wire of the plurality of first conductive wires;
    a circuit device having a plurality of connecting terminals, wherein each of the connecting terminals is corresponding with one of the conductive bumps;
    a third dielectric material covering the circuit device and the wiring region; and
    an insulation sealant located among said circuit device, said first dielectric material, said second dielectric material, and said third dielectric material, wherein the insulation sealant fills a gap between the circuit device and the second dielectric material.

2. The package structure of claim 1, further comprising:
    a blocking frame positioned between the bump region and the wiring region, wherein the insulation sealant is above the blocking frame.

3. The package structure of claim 2, wherein the blocking frame comprises metal or organic insulation material.

4. The package structure of claim 1, further comprising:
    a first conductive pillar formed on a second conductive wire of said first conductive wires, wherein said first conductive pillar is surrounded by the third dielectric material.

5. The package structure of claim 1, wherein the circuit device comprises a semiconductor chip or an electronic component.

6. The package structure of claim 1, further comprising:
    a pillar layer positioned below the conductive pattern layer and comprising a plurality of second conductive pillars and a fourth dielectric material, wherein said fourth dielectric material surrounds the plurality of second conductive pillars; and
    a redistribution layer positioned below the pillar layer and comprising a plurality of second conductive wires and a fifth dielectric material, wherein said fifth dielectric material surrounds the plurality of second conductive wires.

7. A method for fabricating a package structure, comprising steps of:
    (A) forming a conductive pattern layer on a carrier substrate, wherein the conductive pattern layer has a bump region comprising a plurality of conductive bumps and a wiring region comprising a plurality of conductive wires;
    (B) forming a first dielectric layer on the carrier substrate to surround the plurality of conductive bumps, and forming a second dielectric material on the carrier substrate to cover and top a first conductive wire of the plurality of conductive wires;
    (C) disposing a circuit device with a plurality of connecting terminals on the bump region while enabling each of the connecting terminals to correspond with one of the conductive bumps;
    (D) forming an insulation sealant on the second dielectric material and around the circuit device, wherein the insulation sealant is applied to fill a gap between the circuit device and the second dielectric material;
    (E) forming a third dielectric material on the carrier substrate to cover the circuit device and the wiring region, wherein said insulation sealant is located among said circuit device, said first dielectric material, said second dielectric material, and said third dielectric material;
    (F) removing the carrier substrate and forming a fourth dielectric material on the conductive pattern layer and the circuit device, wherein the fourth dielectric material surrounds the plurality of conductive bumps and the plurality of connecting terminals of the circuit device; and
    (G) forming a plurality of metal pillars in the fourth dielectric material, wherein each of the metal pillars is connected to one of the conductive bumps and the conductive wires.

8. The method of claim 7, further comprising:
    forming a plurality of conductive pillars on the plurality of conductive wires before the step (D).

9. The method of claim 7, wherein the circuit device comprises a semiconductor chip or an electronic component.

10. A method for fabricating a package structure, comprising steps of:
(A) forming a conductive pattern layer on a carrier substrate, wherein the conductive pattern layer has a bump region comprising a plurality of conductive bumps, a blocking frame having edgings surrounding the bump region, and a wiring region comprising a plurality of conductive wires surrounding the metal blocking frame;
(B) forming a second dielectric material on the carrier substrate while enabling the second dielectric material to cover the metal blocking frame and the plurality of conductive wires;
(C) disposing a circuit device with a plurality of connecting terminals on the bump region and the metal blocking frame while enabling each of the connecting terminals corresponding with one of the conductive bumps and the sidewalls of the circuit device to be arranged on the edgings of the blocking frame;
(D) forming an insulation sealant on the second dielectric material and around sidewalls of the circuit device, wherein the insulation sealant fills a gap between the circuit device and the second dielectric material;
(E) forming a third dielectric material on the carrier substrate while enabling the third dielectric material to cover the circuit device and the wiring region;
(F) removing the carrier substrate and forming a fourth dielectric material on the conductive pattern layer and the circuit device, while enabling the fourth dielectric material to surround the plurality of conductive bumps and the plurality of connecting terminals of the circuit device; and
(G) forming a plurality of metal pillars in the fourth dielectric material while enabling each of the metal pillars to be connected to one of the conductive bumps and the conductive wires.

11. The method of claim 10, further comprising:
forming a plurality of conductive pillars on the plurality of conductive wires before the step (D).

12. The method of claim 10, wherein the circuit device comprises a semiconductor chip or an electronic component.

* * * * *